United States Patent [19]

Ohsawa

[11] Patent Number: 5,031,150

[45] Date of Patent: Jul. 9, 1991

[54] CONTROL CIRCUIT FOR A SEMICONDUCTOR MEMORY DEVICE AND SEMICONDUCTOR MEMORY SYSTEM

[75] Inventor: Takashi Ohsawa, Yokohama, Japan

[73] Assignee: Kabushiki Kaisha Toshiba, Kawasaki, Japan

[21] Appl. No.: 393,784

[22] Filed: Aug. 15, 1989

[30] Foreign Application Priority Data

Aug. 26, 1988 [JP] Japan .................. 63-211827

[51] Int. Cl.⁵ .................. G11C 7/00; G11C 11/413
[52] U.S. Cl. .................. 365/193; 365/194; 365/189.01; 365/233
[58] Field of Search .................. 365/193, 194, 189.01, 365/233, 233.5, 189.08, 189.05

[56] References Cited

U.S. PATENT DOCUMENTS

| | | | |
|---|---|---|---|
| 4,575,825 | 3/1986 | Ozaki | 365/194 X |
| 4,596,004 | 6/1986 | Kaufman | 365/194 X |
| 4,656,612 | 4/1987 | Allan | 365/194 X |
| 4,809,230 | 2/1989 | Konishi et al. | 365/193 |
| 4,823,322 | 4/1989 | Miyatake et al. | 365/233 X |
| 4,866,675 | 9/1989 | Kawashima | 365/193 X |

Primary Examiner—Alyssa H. Bowler
Attorney, Agent, or Firm—Finnegan, Henderson, Farabow, Garrett and Dunner

[57] ABSTRACT

A control circuit for a dynamic memory device comprises first timer means for delaying the Row Address Stroke ($\overline{RAS}$) signal by a first delay time and supplying the delayed $\overline{RAS}$ signal to a row control circuit, and a second timer means for delaying the $\overline{RAS}$ signal by a second delay time and supplying this delayed $\overline{RAS}$ signal to a column control circuit.

27 Claims, 14 Drawing Sheets

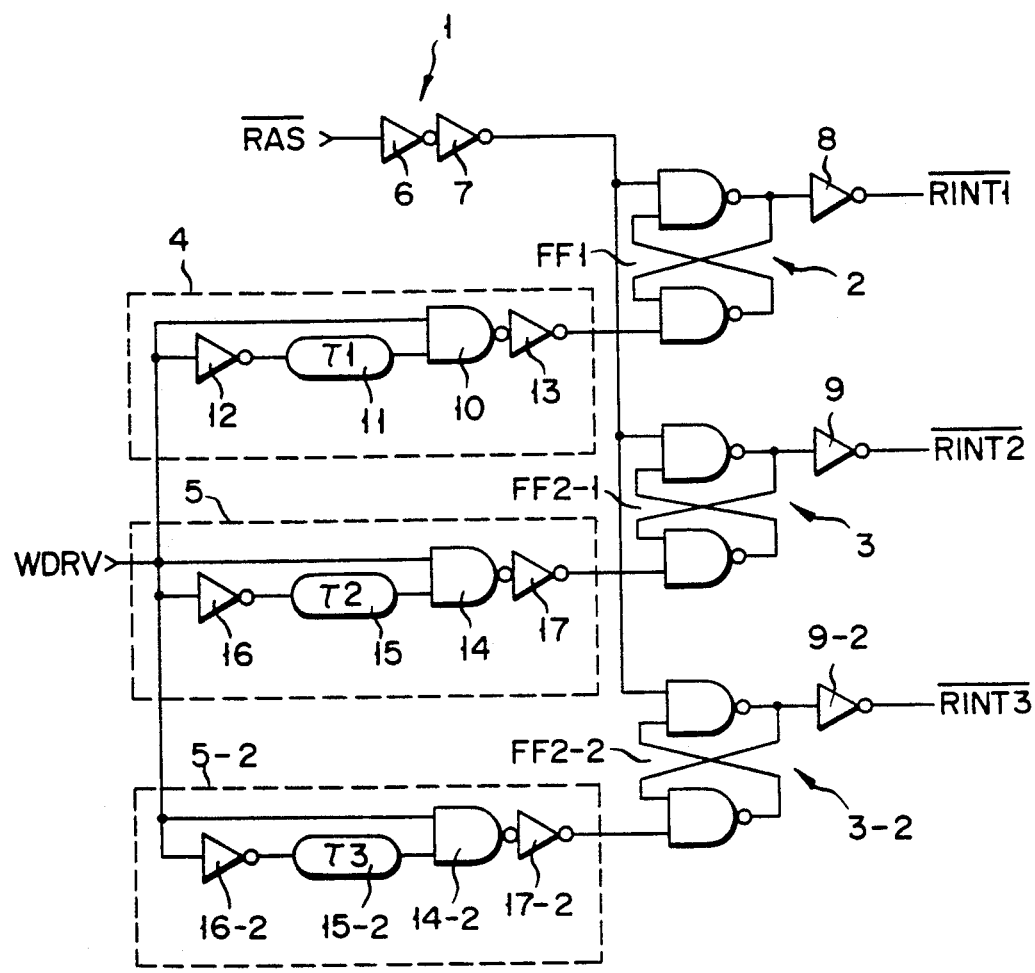
F I G. 2A

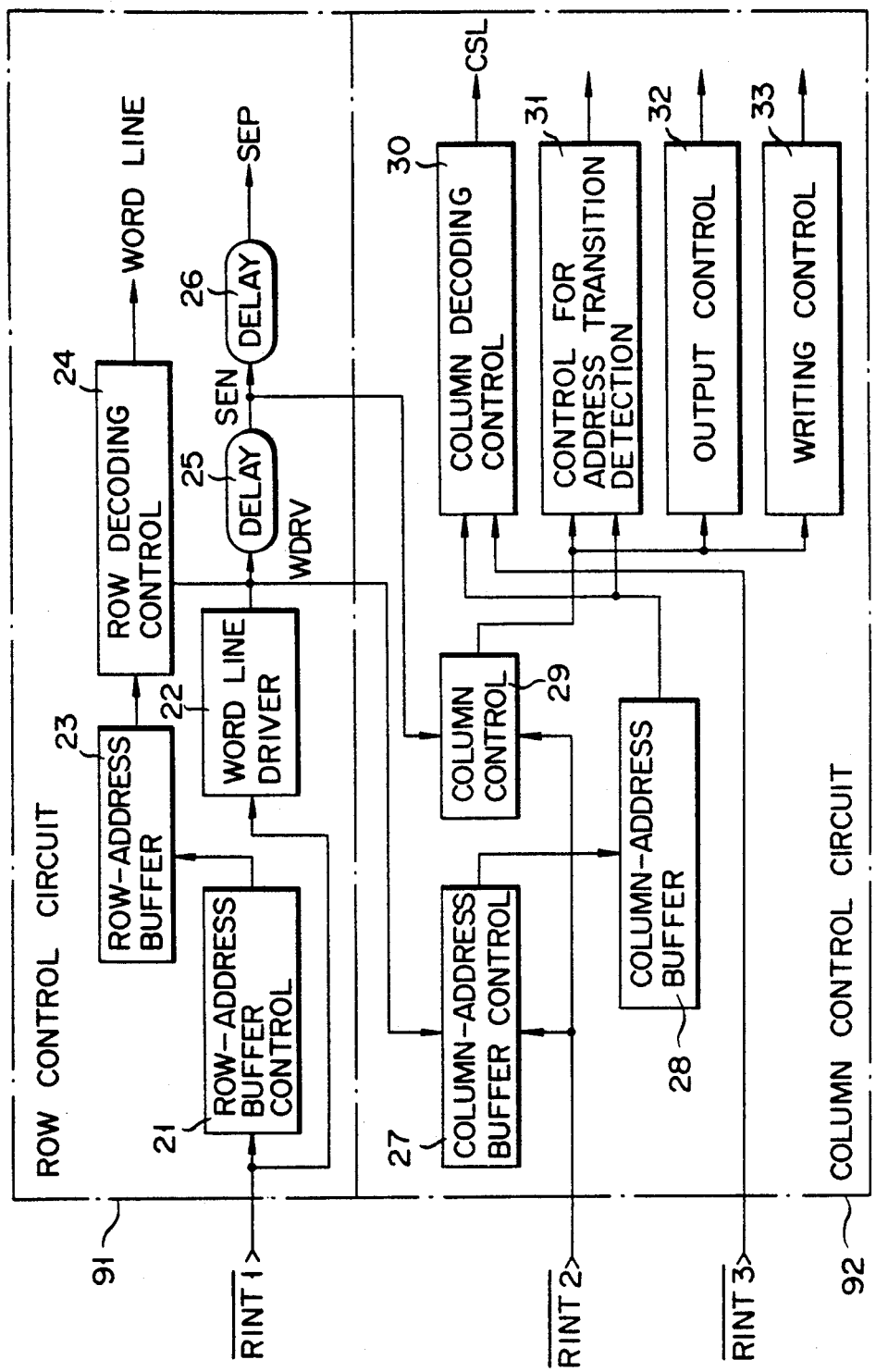
F I G. 2B

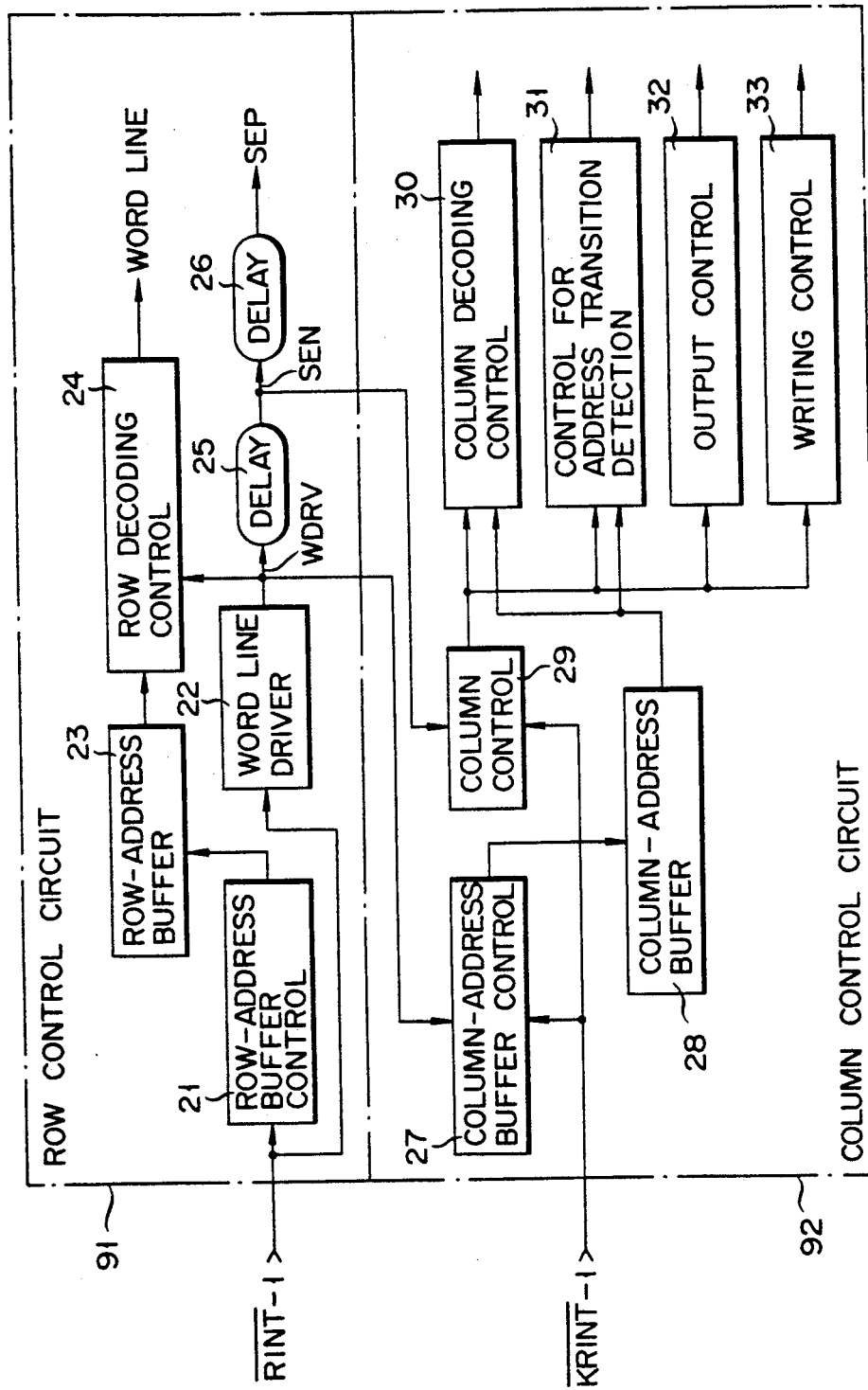
F I G. 3B

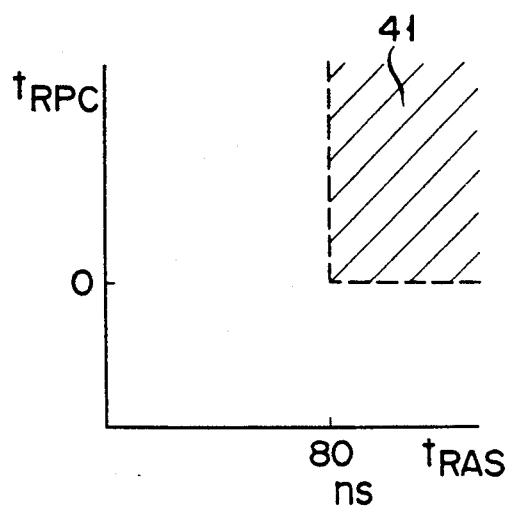
F I G. 5
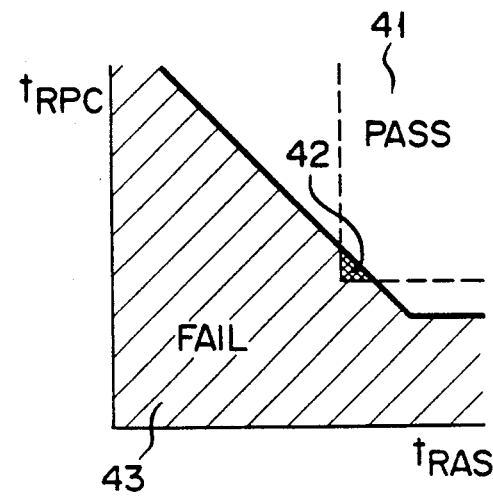
F I G. 6
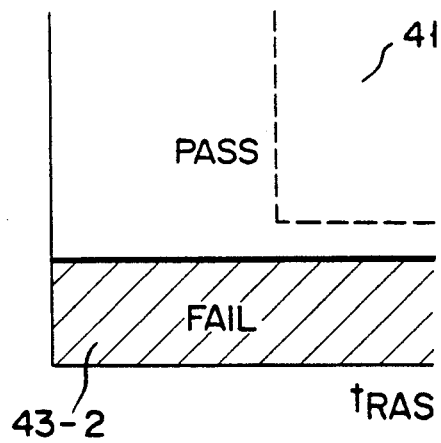
F I G. 7

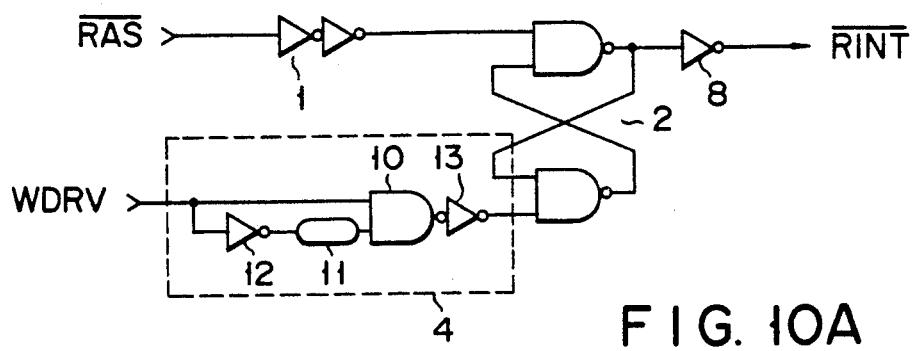
F I G. 10A
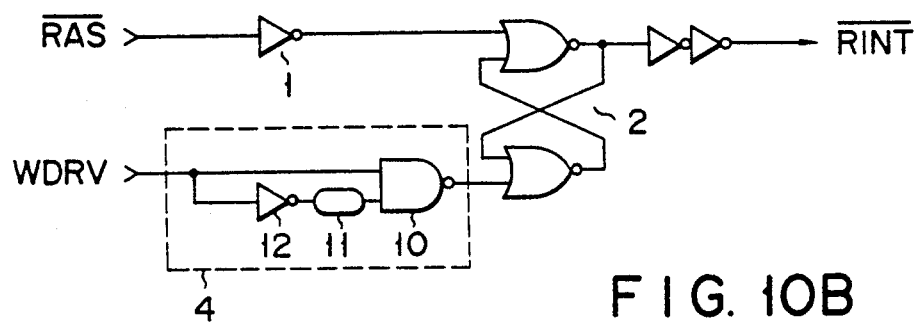
F I G. 10B
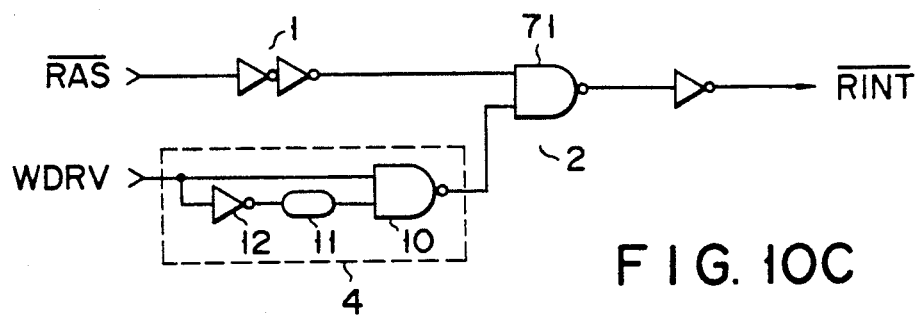
F I G. 10C
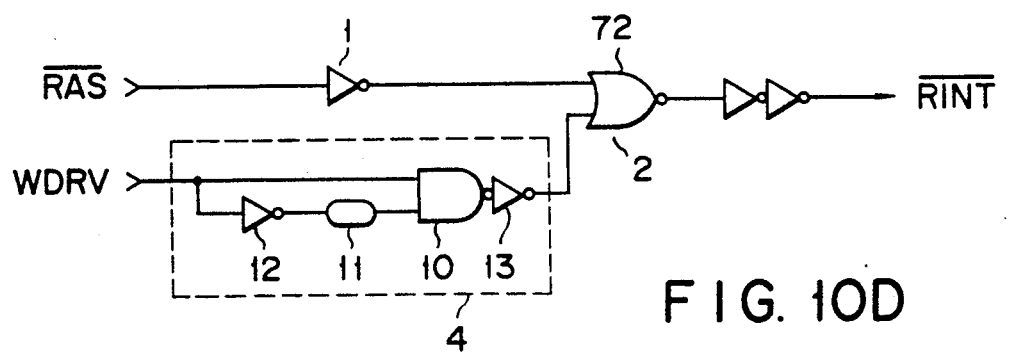
F I G. 10D

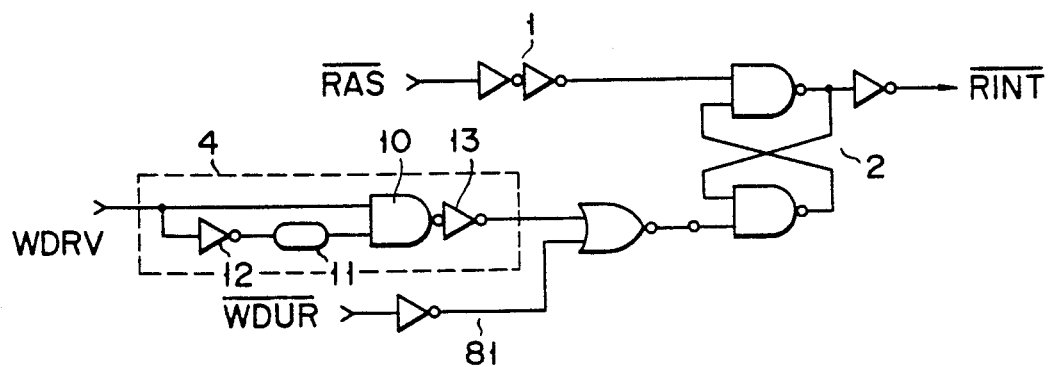
F I G. 10E
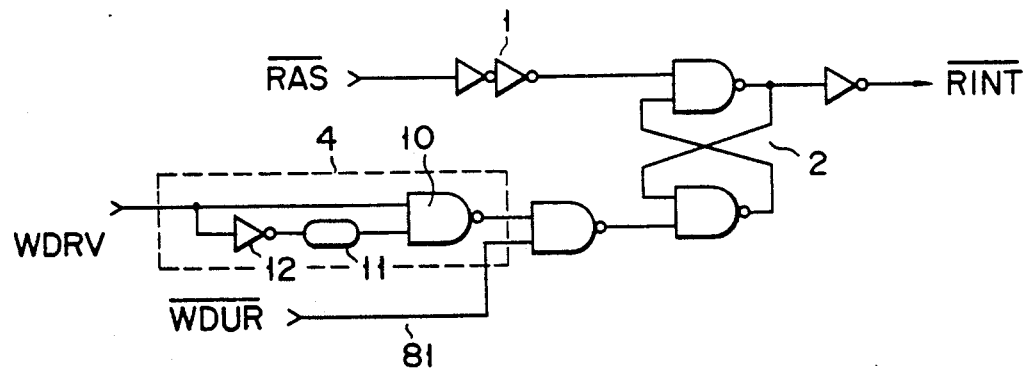
F I G. 10F

CONTROL CIRCUIT FOR A SEMICONDUCTOR MEMORY DEVICE AND SEMICONDUCTOR MEMORY SYSTEM

BACKGROUND OF THE INVENTION

1. Field of the Invention

The present invention relates to a semiconductor memory and, more particularly to a dynamic memory and also a dynamic memory system, capable of performing either $\overline{RAS}$ time-out function or a function equivalent thereto, in accordance with a $\overline{RAS}$ signal supplied from an external device.

2. Description of the Related Art

To use a conventional dynamic random-access memory (hereinafter referred to as "DRAM"), the user must input a $\overline{RAS}$ (Row-Address Strobe) to the memory at the timing shown in FIG. 11. Recently, a new type of a DRAM has been developed which has a $\overline{RAS}$ time-out function and can automatically maintain an internal row-address strobe ($\overline{RINT}$) at an active level (i.e., a low level) for a prescribed period as is illustrated in FIG. 13, in response to the row-address strobe ($\overline{RAS}$) supplied from an external device.

Due to the $\overline{RAS}$ time-out function, the user need not care about the timing of precharging the $\overline{RAS}$ to a high level, and it is easy for him or her to use the DRAM. Also, due to the $\overline{RAS}$ time-out function, the data stored in the memory cells of the DRAM remains undestroyed even if noise enters the $\overline{RAS}$, inevitably precharging the $\overline{RAS}$.

The $\overline{RAS}$ time-out function is indeed helpful in this respect, but it raises the following problems when it is applied to a high-integration, high-speed DRAM.

As is shown in FIG. 14, there are two terms during which signals can be input to a DRAM. The first is a $\overline{RAS}$-active term tRAS, and the second is a $\overline{RAS}$-precharge term tRP. The cycle time tRC of the DRAM is given as follows:

$$tRC = tRAS + tRP + 2tT \quad (1)$$

where tT is the transition time tT required for switching the $\overline{RAS}$ from the low level to the high level, or vice versa. The lower limits for tRC, tRAS, tRP, and tT are predetermined, as is shown in the following table. This means that the DRAM must be operable normally even if tRC, tRAS, tRP, and tT are reduced to these minimum values.

| | |
|---|---|
| tRC min | 150 ns |
| tRAS min | 80 ns |
| tRP min | 60 ns |
| tT min | 5 ns |

One of the advantages of the $\overline{RAS}$ time-out function is that the lower limit is not set to tRAS. (If the lower limit is set, the $\overline{RAS}$ must be held at the low level for the period of 80 ns, as can be understood from the above table.) Hence, the user can set the $\overline{RAS}$ at the high level much earlier than the case where a lower limit is set to tRAS. Since the number of critical timings of operation the DRAM is thus reduced by one, it becomes easy for the user to use the DRAM. However, the DRAM must have a timer for maintaining the internal $\overline{RAS}$ (i.e., the $\overline{RINT}$) for 80 ns.

In the conventional DRAM, which is not able to perform the $\overline{RAS}$ time-out function, the potential of a word line increases to supply data stored in a memory cell to a bit line, upon lapse of some time after the $\overline{RAS}$ has switched to the low level, as can be understood from FIG. 12. At the time a potential difference is made between the pair of bit lines, the sense amplifier connected between these bit lines is activated, thus amplifying the potential difference. When the $\overline{RAS}$ is switched to the high level, the potential of the word line decreases, whereby the data is stored into the memory cell. The moment the potential of the word line decreases to 0 V, these bit lines are equalized to potential VCC/2, where VCC is the power-source potential.

The higher the integration density and speed of the DRAM, the longer the sense amplifier requires to amplify the potential difference between the pair of bit lines, and at the same time, the shorter the time allowed for the restoring of the bit lines. For instance, if the $\overline{RAS}$ access time is 80 ns (as in a 4M-bis DRAM of the first generation), tRASmin is 80 ns, and the bit lines must be restored within 80 ns. Further, in the case of a 4M-bit DRAM manufactured by the conventional method and having three polysilicon layers and one aluminum layer, the bit line must be restored within only 20 ns after the P-channel sense amplifier has been activated, when VCC=4 V, Vtn=1.0 V, Vtp=−1.0 V, and Tc=85° C.—all being the worst conditions possible. (Vth is the threshold voltage of the N-channel transistors used in the DRAM, and Vtp is that of the P-channel transistors used therein.) It is practically impossible to restore the bit lines to a sufficiently high level within so short a time as 20 ns.

The time required for sensing and amplifying the potential difference between the pair of bit lines can be reduced by using a multi-level metal wiring technique. The use of such technique requires a more complex method to manufacture the DRAM, and results in a higher cost of the DRAM. Hence, in the DRAM unable to perform $\overline{RAS}$ time-out function, if the $\overline{RAS}$ is precharged within the tRASmin, the potential of each word line inevitably will decrease to 0 V before the potential difference between the bit lines is sufficiently amplified. Consequently, sufficient data cannot be stored into the memory cell, inevitably causing soft errors and impairing the data holding characteristic of the DRAM.

To avoid soft errors and the deterioration of data holding characteristic, the DRAM must be modified to perform the $\overline{RAS}$ time-out function and be equipped with a timer to hold the internal $\overline{RAS}$ (i.e., $\overline{RINT}$) at the low level for a period longer than tRASmin of 80 ns. If the DRAM is so modified and has a timer, the potential difference between the bit lines will be sufficiently amplified within the tRAMmin of 80 ns, provided that the potential of each word line reduces to 0 V and the pair of bit lines are equalized to potential VCC/2, fully within the tRPmin of 60 ns.

However, when the timer holds the internal $\overline{RAS}$ at the low level for a period longer than tRASmin of 80 ns, a problem will arise. If the data-reading operation is prohibited during the preceding operation cycle of the DRAM (for example $\overline{RAS}$ only refresh cycle), no data should be read from the DRAM during a period tRPC starting at the precharging of the $\overline{RAS}$ and ending at the activation of $\overline{CAS}$ (Column-Address Strobe) as shown in FIG. 4. (The period tRPC must have its minimum value of 0 ns even if tRASmin is 80 ns.) This condition cannot be satisfied when the internal $\overline{RAS}$ is set at the low level longer than tRASmin of 80 ns.

As has been described, the $\overline{RAS}$ time-out function makes it unnecessary for the user to care about the timing of precharging the $\overline{RAS}$ to a high level, and also prevents the data stored in the memory cells of the DRAM from being destroyed even if noise enters the $\overline{RAS}$. Nonetheless, this $\overline{RAS}$ time-out function cannot apply to a DRAM which has a higher integration density and operates at a higher speed, and in which a longer time is required to amplify the potential difference between each pair of bit lines, and the tRASmin is shorter. In order to lengthen the term tRAS, without changing the term tRC, the term tRP can be reduced internally. If this method is used, however, the term tRPC will fail to have its minimum value.

This problem results from the fact that the prior-art DRAM capable of performing the $\overline{RAS}$ time-out function has only one timer, and the output of this timer, i.e., the internal tRAS, controls all other circuits of the DRAM when the external tRAS is too short.

SUMMARY OF THE INVENTION

An object of the present invention is to provide a dynamic memory and also a dynamic memory system, capable of operating fast and correctly, merely by activating an externally supplied timing signal $\overline{RAS}$ for a short time of 80 ns.

Another object of this invention is to provide a semiconductor memory device comprising an array of memory cells, a plurality of sense amplifiers, a row control circuit, a column control circuit, a $\overline{RAS}$ input terminal for receiving a row-address strobe signal, and at last two timers for delaying the $\overline{RAS}$ signal and supplying the delayed $\overline{RAS}$ signals to the row control circuit and the column control circuit, respectively.

Since the two delayed $\overline{RAS}$ signals output by the timers are supplied to the row control circuit and the column control circuit, sufficient periods of time are provided for precharging the $\overline{RAS}$ signal and operating the sense amplifiers completely. Therefore, the memory device according to the present invention can operate at high speed. The timers can either be incorporated in the memory-cell chip or can be arranged outside the memory-cell chip. In either case, the memory device according to the invention can operate at high speed even if it has a high integration density.

BRIEF DESCRIPTION OF THE DRAWINGS

FIG. 2A is a circuit diagram showing the internal $\overline{RAS}$ signal generating section incorporated in a second memory device according to the invention;

FIG. 2B is a block diagram illustrating the control circuits which are used in the second memory device and operate under the control of the internal $\overline{RAS}$ signals generated by the section shown in FIG. 2A;

FIG. 3B is a block diagram illustrating two groups of control circuits which are used in the third memory device and operate under the control of the internal signals generated by the section shown in FIG. 3A;

FIGS. 5, 6, and 7 are graphs representing the operation characteristics of the memory devices of the present invention;

FIGS. 10A to 10F are circuit diagrams, each showing circuit which can be used in the present invention.

DETAILED DESCRIPTION OF THE PREFERRED EMBODIMENTS

A DRAM, which is a first embodiment of the present invention, will now be described with reference to FIGS. 1A, 1B, and 1C.

Figure 1A:
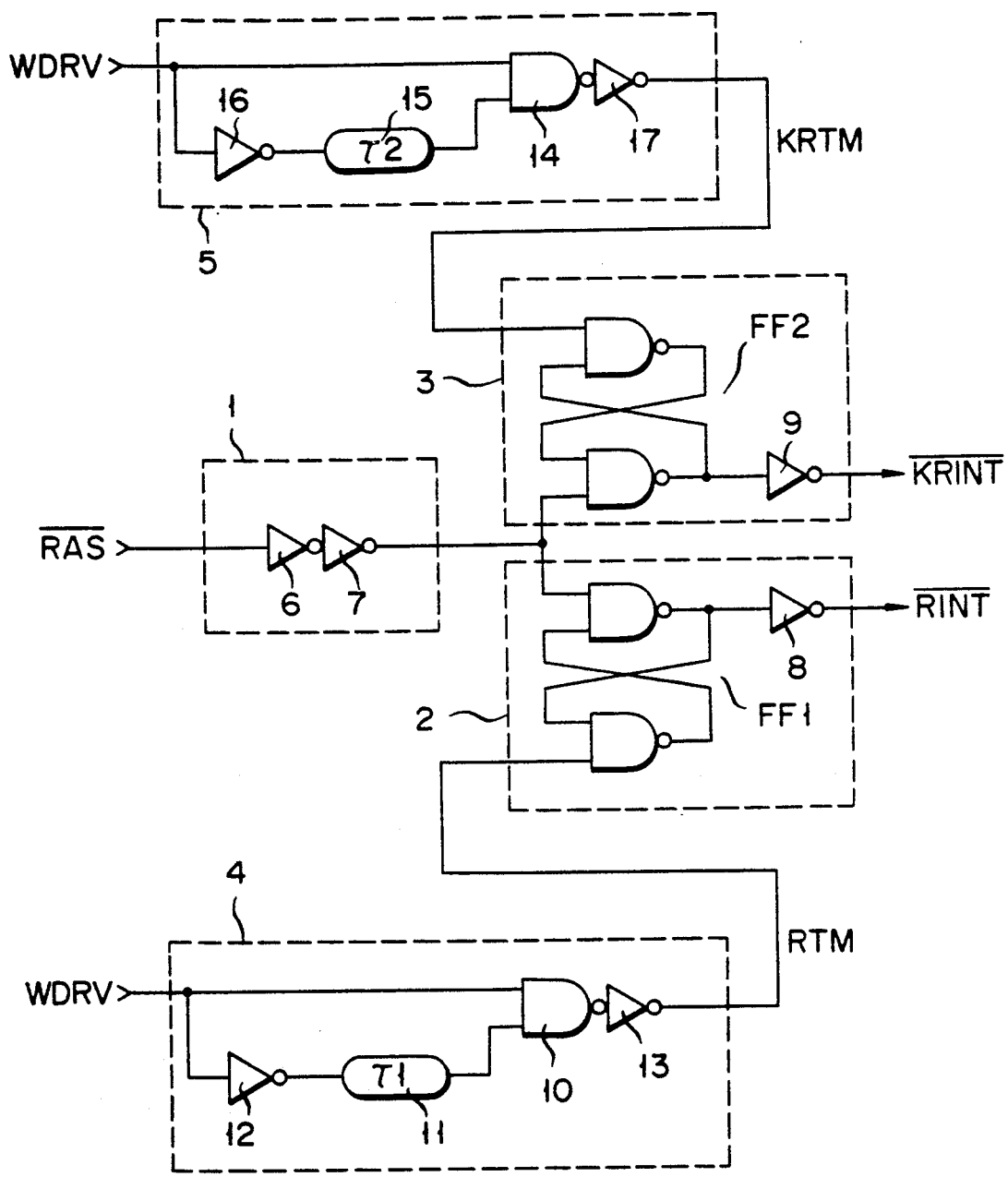
FIG. 1A is a diagram showing the internal $\overline{RAS}$ signal generating section incorporated in a first memory device according to the invention.
Figure 1B:
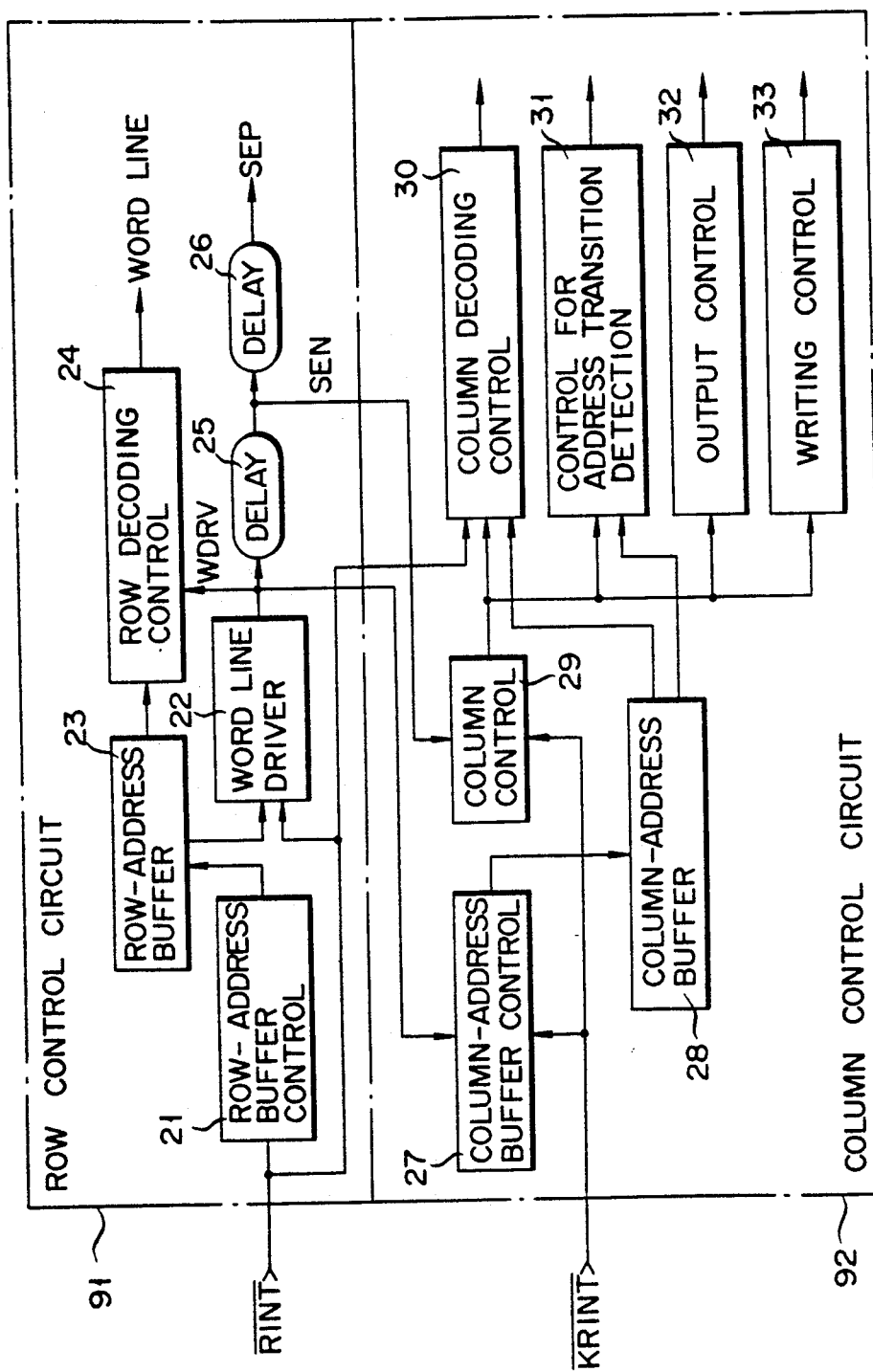
FIG. 1B is a block diagram illustrating two groups of control circuits which are incorporated in the first memory device and operate under the control of the internal $\overline{RAS}$ signals generated by the section shown in FIG. 1A.
Figure 1C:
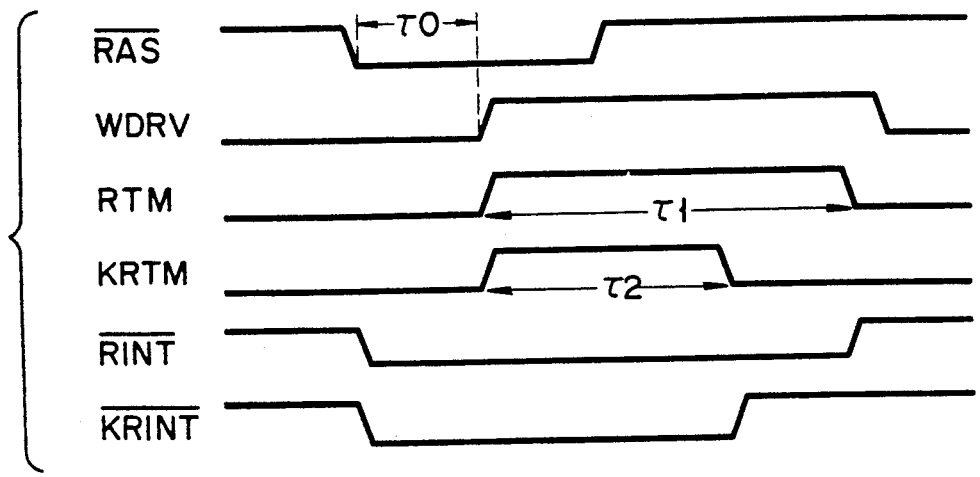
FIG. 1C is a timing chart explaining how the internal $\overline{RAS}$ signals output by the section shown in FIG. 1A control the circuits shown in FIG. 1B.

FIG. 1A illustrates the internal $\overline{RAS}$ signal generating section incorporated in this DRAM, and FIG. 1B shows the two control circuits which are also incorporated in the DRAM and operate under the control of the internal $\overline{RAS}$ signals generated by the $\overline{RAS}$ signal generating section, as will be explained later in detail.

As is illustrated in FIG. 1A, the internal $\overline{RAS}$ signal generating section comprises an external $\overline{RAS}$ input buffer 1, a first internal $\overline{RAS}$ signal generating circuit 2, a second internal $\overline{RAS}$ signal generating circuit 3, a first timer circuit 4, and a second timer circuit 5. The buffer 1 is connected to receive a $\overline{RAS}$ signal supplied from an external device It comprises two inverters 6 and 7 coupled in series. The circuits 2 and 3 are designed to generate a first internal $\overline{RAS}$ signal ($\overline{RINT}$) and a second internal $\overline{RAS}$ signal ($\overline{KRINT}$, respectively, from the external $\overline{RAS}$ signal. The signals $\overline{RINT}$ and $\overline{KRINT}$ will control a row-address control circuit and a column-address control circuit (both later described), respectively. The first internal $\overline{RAS}$ signal generating circuit 2 comprises a set-reset type flip-flop FF1 and an inverter 8 connected to the set output of the flip-flop FF1. Similarly, the second internal $\overline{RAS}$ signal generating circuit 3 comprises a set-reset type flip-flop FF2 and an inverter 9 connected to the set output of the flip-flop FF2. The flip-flop used in either internal signal generating circuit is composed of two 2-input NAND gates which are cross-connected to each other. The signals output by the inverters 8 and 9 are the internal $\overline{RAS}$ signals RINT and KRINT, respectively. The set terminals of the flip-flops FF1 and FF2 are connected to the output of the $\overline{\text{RAS}}$ input buffer 1. The reset terminals of the flip-flops FF1 and FF2 are connected to the outputs of the timer circuits 4 and 5 to receive the output signals RTM and KRTM of these timer circuits, respectively.

The first timer circuit 4 comprises a 2-input NAND gate 10, a first delay circuit 11, and two inverters 12 and 13. The first input of the NAND gate 10 is connected to receive a word line-driving signal WDRV. The inverter 12 receives the word-driving signal WDRV and inverts the signal. The first delay circuit 11 receives the output signal of the inverter 12 and delays the signal by time $\tau 1$ and supplies the signal to the second input of the NAND gate 10. The inverter 13 inverts the output signal of the NAND gate 10. The signal output by this inverter 13 is the signal RTM.

The second timer circuit 5 comprises a 2-input NAND gate 14, a second delay circuit 15, and two inverters 16 and 17. The first input of the NAND gate 14 is connected to receive a word-driving signal WDRV. The inverter 16 receives the word-driving signal WDRV and inverts the signal. The second delay circuit 15 receives the output signal of the inverter 16 and delay the signal by time $\tau 2$ and supplies the signal to the second input of the NAND gate 14. The inverter 17 inverts the output signal of the NAND gate 10. The signal output by this inverter 17 is the signal KRTM.

The control circuits 91 and 92, both incorporated in the DRAM, will now be described, with reference to FIG. 1B. The circuit 91, which is a row control circuit, comprises a row-address buffer controller 21, a word line driver 22, a row-address buffer 23, a row decoder 24, and two delay circuits 25 and 26. The row-address buffer controller 21 controls the row-address buffer 23 in accordance with the signal $\overline{\text{RINT}}$ output from the first internal $\overline{\text{RAS}}$ signal generating circuit 2. The output signal SEN of the delay circuit 25 is used to activate the N-channel sense amplifiers (not shown) incorporated in the DRAM. The circuit 92, which is a column control circuit, comprises a column-address buffer controller 27, a column-address buffer 28, a column controller 29, a column decoder 30, an address-transition detector 31, an output controller 32, and a write controller 33. The column-address buffer controller 27 controls the column-address buffer 28 in accordance with the signal $\overline{\text{KRINT}}$ output from the second internal $\overline{\text{RAS}}$ signal generating circuit 3.

The operation of the circuits shown in FIGS. 1A and 1B will now be explained, with reference the timing chart shown in FIG. 1C.

First, the word-line driving signal WDRV is at a low level. When the word-line driving signal WDRV rises from the low level to a high level, a word line WL is driven. The output RTM of the first timer circuit 4 then rises from the low level to the high level, thereby setting the flip-flop FF1 incorporated in the first internal $\overline{\text{RAS}}$ signal generating circuit 2. The inverter 8 inverts the output signal of the flip-flop FF1 into the signal $\overline{\text{RINT}}$. The signal $\overline{\text{RINT}}$ is not influenced by the external $\overline{\text{RAS}}$ signal and is thus clamped at the low level. In other words, the $\overline{\text{RAS}}$ time-out function is performed. Some time thereafter, the sense amplifiers (not shown) are activated. Upon lapse of the delay time $\tau 1$ of the first delay circuit 11 after the signal WDRV has risen to the high level, the output RTM of the first timer circuit 4 falls to the low level. At this time, the $\overline{\text{RAS}}$ time-out function is stopped, and the signal $\overline{\text{RINT}}$ is influenced by the external $\overline{\text{RAS}}$ signal and starts performing its function. The delay time $\tau 1$ of the first delay circuit 11 is equal to the longer one of either the time required for increasing the potential of the higher-potential bit line of each pair to the VCC potential after the sense amplifiers (not shown) have been activated, or the time required for decreasing the potential of the lower-potential bit line of each pair to the VSS potential after the sense amplifiers have been activated. Hence, the delay time $\tau 1$ can be determined solely by the speed of the charging the bit lines, not influenced by the shortest possible term during which the $\overline{\text{RAS}}$ signal remains at the low level.

On the other hand, when the word-line driving signal WDRV rises from the low level to the high level and thus starts driving the word line WL, the output KRTM of the second timer circuit 5 rises from the low level to the high level. As a result, the flip-flop FF2 incorporated in the second internal $\overline{\text{RAS}}$ signal generating circuit 3 is set, and the output signal $\overline{\text{KRINT}}$ of this circuit 3 is clamped at the low level, not influenced by the external $\overline{\text{RAS}}$ signal. In other words, the RAS time-out function is started. Upon lapse of the delay time $\tau 2$ of the second delay circuit 15 after the signal WDRV has risen to the high level, the output signal KRTM of the second timer circuit 5 falls to the low level. At this time, the $\overline{\text{RAS}}$ time-out function is stopped, and the signal $\overline{\text{KRINT}}$ is influenced by the external $\overline{\text{RAS}}$ signal and starts performing its function. The delay time $\tau 2$ of the second delay circuit 15 is equal to either tRASmin or a little shorter than tRASmin, not influenced by the speed of the charging the bit lines.

Hence, the term during which the internal $\overline{\text{RAS}}$ signal remains at the low level is equal to tRAMmin even if the term, during which the external $\overline{\text{RAS}}$ signal supplied to the DRAM remains at the low level, is shorter than tRAMmin. (needless to say, the external signal must remain at the low level longer than the time $\tau$ between the trailing edge of the external $\overline{\text{RAS}}$ signal and the leading edge of the word-line driving signal WDRV.) In other words, the delay time $\tau 1$, the delay time $\tau 2$, and the term tRAMmin have the following relationship:

$$\tau 0 + \tau 2 \leq tRASmin < \tau 0 + \tau 1$$

Even when tRASmin is set at 80 ns, the time required for sufficiently increasing the potential difference between the pair of bit lines is lengthened up to about 40 ns by changing the term tRAS toward the term tRP (i.e., the RAS precharging term). Therefore, the potential difference between the pair of bit lines is sufficiently increased. As a result, the DRAM makes no soft errors, nor is its data holding characteristic impaired at all. Hence, the DRAM can operate at high speed. As has been described, the column control circuit 92 is controlled by the internal $\overline{\text{RAS}}$ signal $\overline{\text{KRINT}}$ which has been generated from the output signal of the second timer circuit 5, and the delay time $\tau 2$ of the delay circuit 15 used in the second timer circuit 15 is shorter than the delay time $\tau 1$ of the delay circuit 11 of the first timer circuit 4. Therefore, the column control circuit 92 can be stopped earlier than the row control circuit 91 in response the second internal $\overline{\text{RAS}}$ signal KRINT. Data can be correctly written into, and read from, the DRAM. Hence, the number of critical timings is reduced by one, by virtue of the $\overline{\text{RAS}}$ time-out function performed by the DRAM.

Figure 2C:
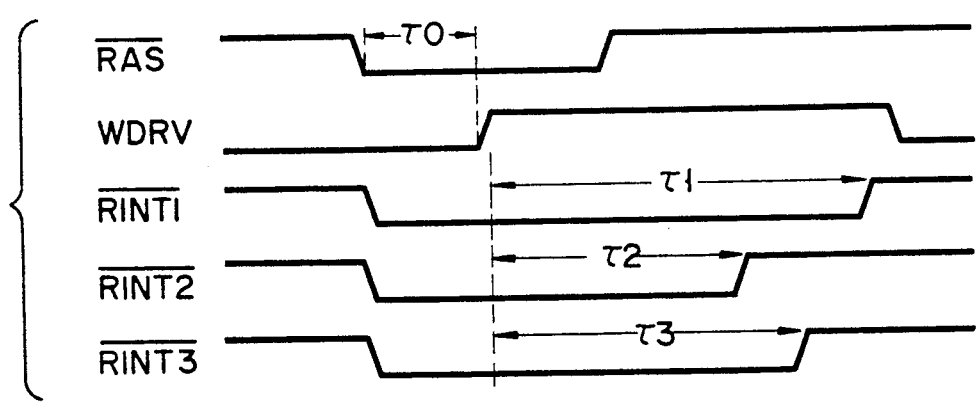
FIG. 2C is a timing chart explaining how the internal $\overline{RAS}$ signals output by the section shown in FIG. 2A control the circuits shown in FIG. 2B.

FIG. 2A illustrates the internal $\overline{\text{RAS}}$ signal generating section incorporated in a DRAM which is a second embodiment of the invention. This internal $\overline{RAS}$ signal generating section is designed to output three internal $\overline{RAS}$ signals RINT1, RINT2, and RINT3. The signal RINT1 will control a row control circuit, and the signals RINT2 and RINT3 will control a column control circuit, as will be described later in detail. As is shown in FIG. 2A, the section comprises an external $\overline{RAS}$ input buffer 1, three internal $\overline{RAS}$ signal generating circuits 2, 3, and 3-2, three timer circuits 4, 5, and 5-2. The buffer 1 is of the same structure as that shown in FIG. 1A. The internal $\overline{RAS}$ signal generating circuits 2, 3, and 3-2 are identical in structure to those shown in FIG. 1A. Also, the timer circuits 4, 5, and 5-2 have the same structure as those shown in FIG. 1A.

The first timer circuit 4 starts operating at the leading edge of a word-line driving signal WDRV, and stops operating upon lapse of time $\tau 1$ when the potential difference between the pair of bit lines increases sufficiently. During this period of time, $\tau 1$, the signal RINT1 remains at a low level, regardless of the voltage value of the external $\overline{RAS}$ signal supplied to the external $\overline{RAS}$ input buffer 1.

The signal RINT1 is supplied to the row control circuit 91. More precisely, as is shown in FIG. 2B, this signal RINT1 is supplied to the low-address buffer controller 21 and the word line driver 22, both incorporated in the control circuit 91. The term tRAS (i.e., the term during which the $\overline{RAS}$ signal remains at the low level) is short but longer than the time required for increasing the potential of the word line WL to the high level. Therefore, the potential of the word line WL remains at the high level up until the potential difference between the bit lines increases sufficiently. When this potential difference becomes great enough, the word line is disabled. Thereafter, the output signal of the row-address buffer 23, also used in the row control circuit 91, equalizes the bit lines; that is, it sets the bit lines at the same potential.

On the other hand, the signal RINT2, which has been generated from the output signal of the second timer circuit 5, is supplied to the column control circuit 92. More precisely, as is shown in FIG. 2B, the signal RINT2 is input to the column-address buffer controller 27 and the column controller 29, both incorporated in the control circuit 92. Like the signal RINT1, this signal RINT2 falls to the low level at the trailing edge of the external $\overline{RAS}$ signal. The signal RINT2 remains at the low level regardless of the voltage value of the external $\overline{RAS}$ signal. This is because the second timer circuit 5 starts operating at the leading edge of the word-line driving signal WDRV. The second timer circuit 5 stops operating upon lapse of time $\tau 2$ which is shorter than the delay time $\tau 1$ of the delay circuit 11 incorporated in the first timer circuit 4. Hence, the signal RINT2 is synchronous with the external $\overline{RAS}$ signal. The period during which this timer circuit 5 functions is either equal to the term tRAMmin of the DRAM or slightly shorter than the term tRAMmin. Therefore, the second timer circuit 5 enables the DRAM to write and read data correctly even if the term tRAS is relatively short. In other words, the second timer circuit 5 also serves to reduce the number of critical timings by one, by virtue of the $\overline{RAS}$ time-out function performed in the DRAM.

The third timer circuit 5-2, which characterizes the second embodiment of the invention, has time constant $\tau 3$ which is greater than $\tau 2$ and less than $\tau 1$; that is, $\tau 2 < \tau 3 < \tau 1$. The signal RINT3, which has been generated from the output signal of the third timer circuit 5-2, is input to the column control circuit 92. More precisely, as is illustrated in FIG. 2B, the signal RINT3 is supplied to the column decoder 30 used in the control circuit 92. The term tRAS of the DRAM is relatively short. Therefore, the signal RINT2 input to the circuits 27 and 29 is reset at the high level earlier than the other internal $\overline{RAS}$ signals RINT1 and RINT3. For some time after the signal RINT2 has been thus reset, the signal RINT3 input to the column decoder 30 remains at the low level. Hence, the column-select line CSL remains selected. However, the signal RINT3 will be reset to the high level earlier than the signal RINT1 input to the row-address buffer controller 21 and the word line driver 22. This is because, $\tau 3 < \tau 1$.

The reason for $\tau 3 < \tau 1$ will be discussed briefly. If the column-select line CSL is reset simultaneously with the signal RINT2, data cannot be completely written into the DRAM in some cases, when the external tRAS is smaller than the tRASmin. This is because the line CSL is inevitably reset before the completion of the data-writing operation. On the other hand, if the column-select line CSL is reset simultaneously with the signal RINT1, no time can be spared for the word line WL to close after the lower-potential one of the bit lines has been set at the VSS potential. Consequently, the magnitude of the data signal to be rewritten into a memory cell is insufficient in some cases, making it impossible to write correct data into the DRAM. The lower-potential bit line is at a potential about 1 V higher than the VSS potential when the column-select line CSL is selected. This is because a P-channel load transistor is connected to a DQ line to protect the data stored in the memory cell. (The DQ line is coupled to the bit line as long as the column-select line CSL remains at the high level, and the DQ line is also at a potential about 1 V higher than the VSS potential when the column-select line CSL is selected.) Nonetheless, since the term tRAS is relatively long, and the $\overline{RAS}$ signal is precharged during this term tRAS, the potential difference between the bit lines is sufficiently great. The magnitude of the data signal is therefore sufficient even if the word line WL is closed when the lower-potential bit line is still at a potential about 1 V higher than the VSS potential. The data can be correctly written into the memory cell.

The DRAM according to the second embodiment is advantageous in two respects. First, the DRAM can operate at high speed even if its integration density is comparatively high. Second, the data can be correctly written into the DRAM. The DRAM can operate at high speed since the term tRP (i.e., the term for precharging the $\overline{RAS}$ signal) is relatively long. Part of the long tRP is added to the term tRAS, thus lengthening this term tRAS during which the signal RINT1 remains at the low level, while maintaining the term tRC (i.e., the RAS-cycle time uncharged). Thus, the term tRAS is longer than tRASmin, the potential difference between the pair of bit lines increases sufficiently in a short cycle time. The data can be correctly written into the DRAM since the signal RINT3, generated from the output signal of the timer circuit 5 which stops operating before the term tRASmin runs out, is reset earlier than the signal RINT1 and later than the signal RINT2, thereby to amplify the data signal to be rewritten into a memory cell before the word line is set at the low level. This is because if the signal RINT3 is reset at the expiration of the term tRASmin, the data-writing operation cannot be correctly performed, and if the signal RINT3 is reset at the leading edge of the signal RINT1, the lower-potential bit line may fail to set at the VSS potential.

Figure 3C:
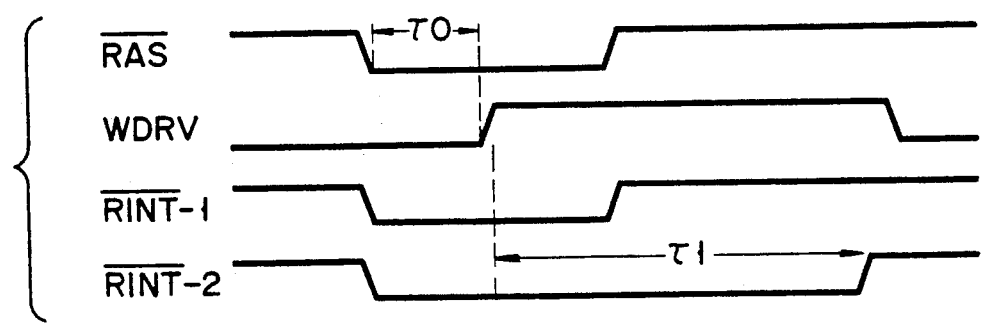
FIG. 3C is a timing chart explaining how the internal $\overline{RAS}$ signals output by the section shown in FIG. 3A control the circuits shown in FIG. 3B.
Figure 3A:
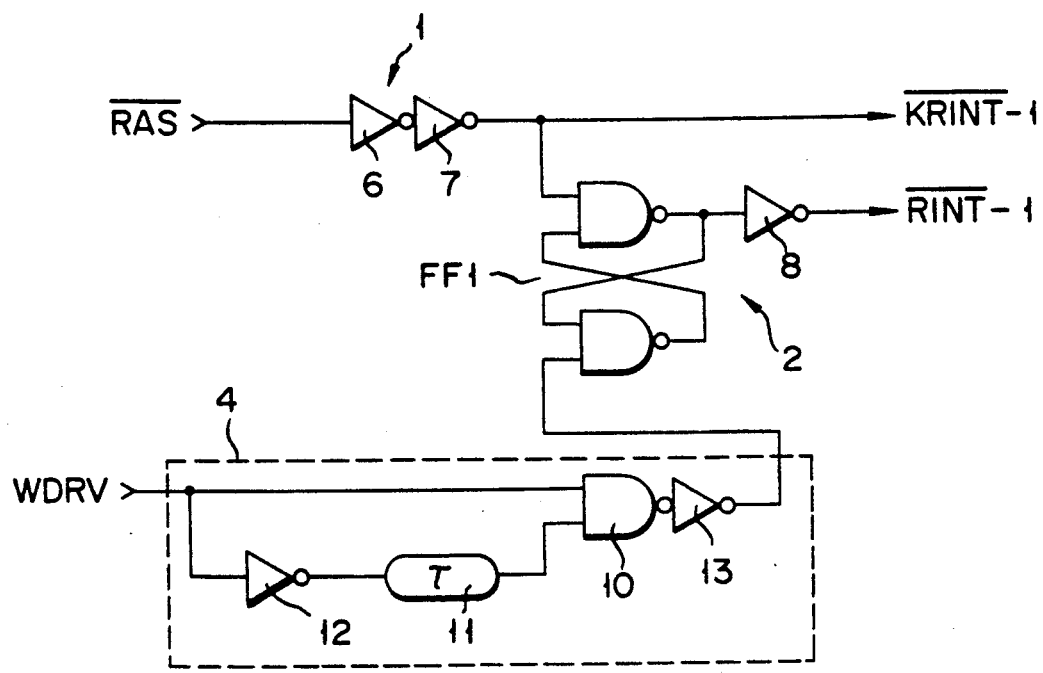
FIG. 3A is a circuit diagram showing the internal $\overline{RAS}$ signal generating section incorporated in a third memory device according to the invention.

FIG. 3A shows the internal $\overline{RAS}$ signal generating section incorporated in a DRAM which is a third embodiment of the invention. FIG. 3B illustrates a row control circuit 91 and a column control circuit 92, both incorporated in this DRAM. FIG. 3C is a timing chart explaining the operations of the control circuits 91 and 92 shown in FIG. 3B. In FIGS. 3A and 3B, the same reference numerals as those used in FIGS. 1A and 1B designate the same components as those shown in FIGS. 1A and 1B.

As may be understood from FIGS. 3A, 3B, and 3C, the third embodiment is characterized in that the timer circuit 4 has a time constant $\tau 1$ greater than the term tRASmin, so that the potential difference between a pair of bit lines can be increased sufficiently within the term tRASmin. Since the term tRP (i.e., the period for precharging the bit lines) is relatively long, the the $\overline{RAS}$-cycle time tRC need not be lengthened even if tRP is used to lengthen the internal tRAS. In order to keep the term defined from the time of precharging the $\overline{RAS}$ signal at tRASmin, the external $\overline{RAS}$ signal, not the internal $\overline{RAS}$ signal generated from the output signal of the timer circuit 4, is used to control the column-address buffer controller 27 and the column-address controller 29, both incorporated in the column control circuit 92.

The operation of the third embodiment will now be described, with reference to FIGS. 3A, 3B, and 3C.

First, the external $\overline{RAS}$ input buffer 1 receives an external $\overline{RAS}$ signal. The section shown in FIG. 3A outputs two internal $\overline{RAS}$ signals RINT-1 and KRINT-1. The signal RINT-1 is not influenced by the external $\overline{RAS}$ signal and remains at the low level, once the external signal has fallen to the low level, and the word-line driving signal WDRV has risen to the high level. The signal RINT-1 comes to be influenced again upon lapse of time $\tau$ during which the potential difference between the bit lines increases sufficiently. This signal RINT-1 is input to the row-address buffer controller 21 and the word-line driver 22 only, as is illustrated in FIG. 3B. Thus, the word line is disabled upon lapse of a period during which the potential difference between the bit lines increases sufficiently even if the term tRASmin is 80 ns. Thereafter, the bit lines are equalized by the output signal of the row-address buffer 23.

On the other hand, the signal KRINT-1 is totally synchronous with the external $\overline{RAS}$ signal. This signal is input to the column-address buffer controller 27 and the column-address controller 29, as is illustrated in FIG. 3B. Hence, the $\overline{RAS}$ signal can be precharged within the term tRASmin. In other words, the signal KRINT-1 can control the column control circuit 92, regardless of the value of $\tau$.

Figure 4:
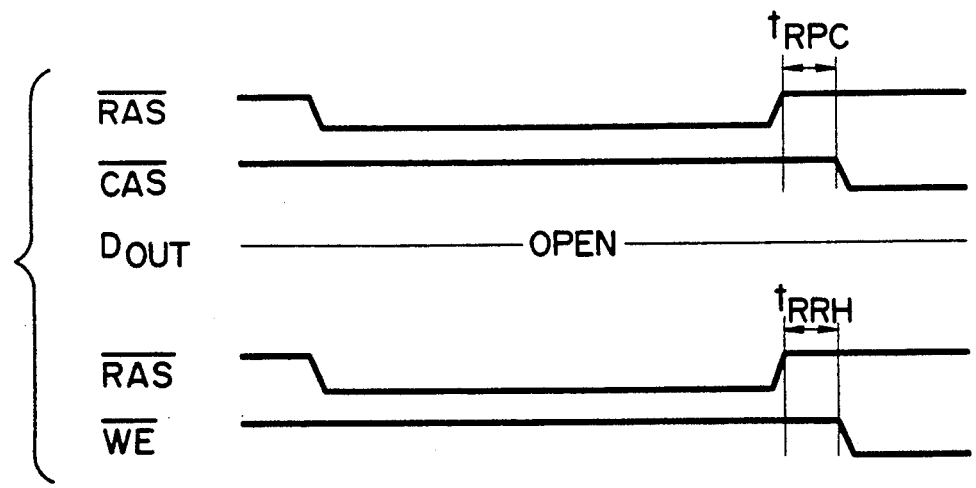
FIG. 4 is a timing chart explaining the operation of a DRAM.

In FIG. 4, two period of time, tRPC ($\overline{RAS}$-to-$\overline{CAS}$ Precharge Time) and tRRH (Read Command Hold Time Reference-to-$\overline{RAS}$) are defined. The period tRPC starts when the $\overline{RAS}$ is precharged and ends when the $\overline{CAS}$ signal is activated. However, there is the rule that the DRAM must not read data Dout through an output buffer (not shown) even if tRPCmin=0 at the end of any operation cycle (e.g., $\overline{RAS}$-only refresh cycle) other than a read cycle. Needless to say, this rule should be observed when tRASmin is 80 ns.

To observe this rule, the DRAM must not read the data Dout in the region 41 of the graph shown in FIG. 5, wherein the term tRAS and the period tRPC are plotted on the X axis and the Y axis, respectively. If the column-address buffer 27 and the column-address controller 29 are controlled by the signal RINT-1 generated from the output signal of the timer circuit 4 whose delay time is longer than the term tRASmin, the DRAM will output the data Dout in the fail region 43 shown in FIG. 6. This region includes a sub-region 42, in which the DRAM should not output the data Dout. This is because the fail region 43 is too large since the rising of the signal RINT-1 is delayed. In the third embodiment of the invention, the signal KRINT-1 does not interfere with the signal RINT-1, and the fail region 43-2 is small and narrow as is illustrated in FIG. 7. As is evident from FIG. 7, the DRAM does not output the data Dout in the region 41, thus observing the above-mentioned rule.

The period tRRH defined in FIG. 4 starts when the $\overline{RAS}$ signal is precharged and ends when the write enable signal $\overline{WE}$ is activated. There is the rule that the DRAM must not write data Din through an input buffer (not shown) even if tRRHmin=0 at the end of any operation cycle (e.g., $\overline{RAS}$-only refresh cycle) other than a write cycle. Since the column-address buffer 28 and the column-address controller 29 are controlled by the signal KRINT-1, not the signal RINT-1, the DRAM observes this rule, too, even when the term tRASmin is 80 ns.

In the third embodiment of the present invention, the signal KRINT-1, which is synchronous with the external signal, is input to the column-address control circuit 92. This solves the following problems inherent in the conventional DRAM.

In the conventional DRAM, the time required for sufficiently increasing the potential difference between any pair of bit lines falls within the term tRASmin (i.e., the minimum pulse width of the $\overline{RAS}$ signal). Therefore, the $\overline{RAS}$ time-out function is performed for two purposes: (i) to reduce the number of critical timings, thus making it easy for the user to operate the DRAM; (ii) to prevent destruction of the data stored in the DRAM.

It is increasing demanded that DRAMs operate at higher speed. To meet this demand, tRAS should also be as short as 80 ns or 60 ns. It is also demanded that DRAM having a larger storage capacity be provided. Generally, the greater the storage capacity of a DRAM, the longer the time required for sufficiently increasing the potential difference between each pair of bit lines. Under these circumstances, the $\overline{RAS}$ time-out function be used for another purpose, that is, to provide a time longer enough to increase said potential difference sufficiently even if the user has set tRASmin of 80 ns or 60 ns to the DRAM. To provide such a long time, a timer having a large time constant must be incorporated in the DRAM chip. Even if this timer is used, the term tRC can be maintained unchanged since the tRP set in the DRAM is far shorter than tRPmin. In other words, it is possible to divide tRC into tRAS and tRP freely in a chip. However, when the column control section of this DRAM, as well as the bit lines and word lines thereof, are controlled by the output signal of the timer, it becomes no longer possible for the DRAM to operate if the period tRPC or the period tRRH are set at their respective minimum values. This problem is solved in the third embodiment of the present invention, by supplying the signal RINT-1, which is synchronous with the external $\overline{RAS}$ signal, to the column control circuit 92. Hence, the DRAM according to the third embodiment can be a high-speed, large-capacity one which is free of soft errors and has good data holding characteristic.

Figure 8A:
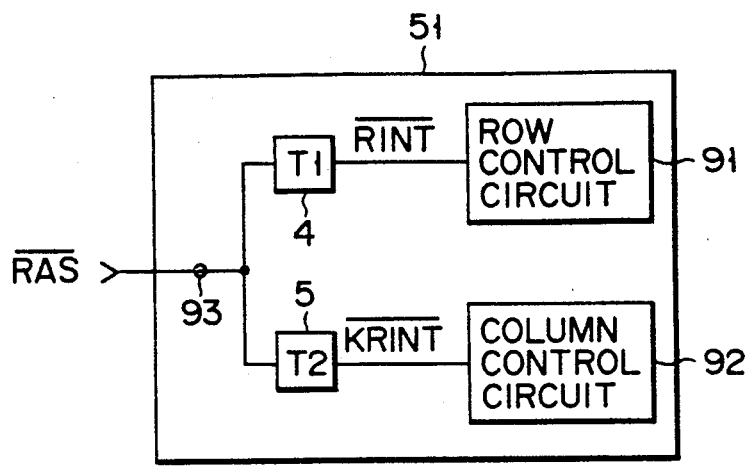
FIGS. 8A, 8B, and 8C are block diagrams schematically illustrating those units of the first, second, and third memory devices, each of which comprises at least one internal $\overline{RAS}$ signal generating section and two control circuits.
Figure 8B:
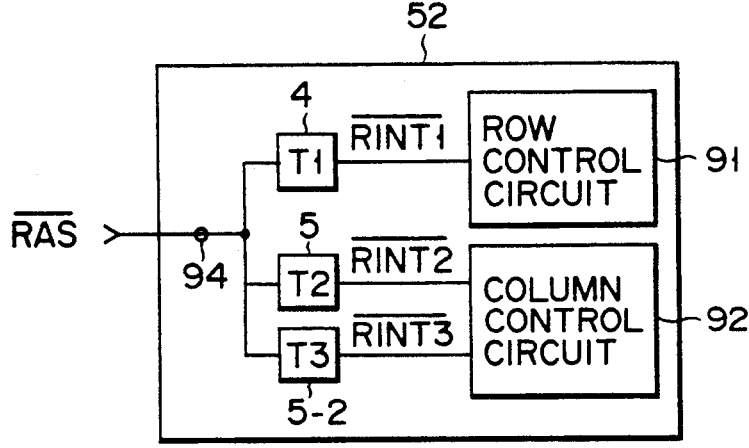
Figure 8C:
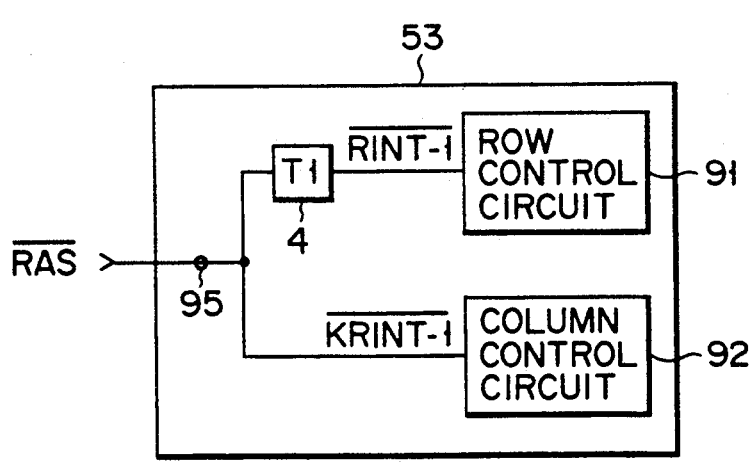

FIGS. 8A, 8B, and 8C are block diagrams schematically showing those units of the first, second, and third embodiments, each of which comprises at least one internal $\overline{RAS}$ signal generating section and two control circuits.

More specifically, the unit shown in FIG. 8A has a chip 51 in which the timer circuits 4 and 5 and the control circuits 91 and 92—all illustrated in FIG. 1B, are incorporated. As can be understood from FIG. 8A, the external $\overline{RAS}$ signal is input to the chip 51. In the chip 51, the timer circuit 4 generates an internal $\overline{RAS}$ signal RINT for controlling the row control circuit 91, whereas the timer circuit 5 generates an internal $\overline{RAS}$ signal KRINT for controlling the column control circuit 92.

The unit illustrated in FIG. 8B has a chip 52 in which the timer circuits 4, 5, and 5-2 and the control circuits 91 and 92—all illustrated in FIG. 2B, are incorporated. As is evident from FIG. 8B, the external signal is input to the chip 52. In the chip 52, the timer circuit 4 generates an internal $\overline{RAS}$ signal RINT1 for controlling the row control circuit 91, the timer circuit 5 generates an internal $\overline{RAS}$ signal RINT2 for controlling the column control circuit 92, and the timer circuit 5-2 generates an internal $\overline{RAS}$ signal RINT3 for controlling also the column control circuit 92.

The unit shown in FIG. 8C has a chip 53 in which the timer circuit 4 and the control circuits 91 and 92 —all illustrated in FIG. 3B are incorporated. As is evident from FIG. 8B, the external $\overline{RAS}$ signal is input to the chip 53. In the chip 53, the timer circuit 4 generates two internal $\overline{RAS}$ signals RINT-1 and KRIN-1 for controlling the row control circuit 91 and the column control circuit 92, respectively.

Figure 9A:
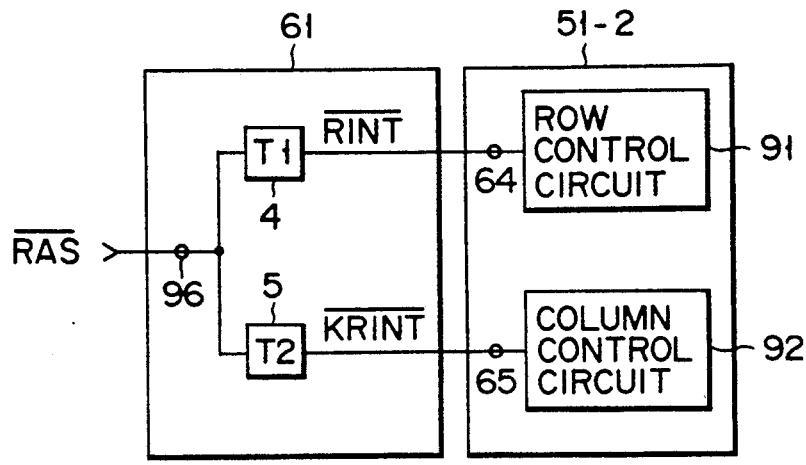
FIGS. 9A, 9B, and 9C are block diagrams schematically illustrating those units of the fourth, fifth, and sixth memory devices according to the invention, each of which comprises at least one RAS signal generating section and two control circuits.
Figure 9B:
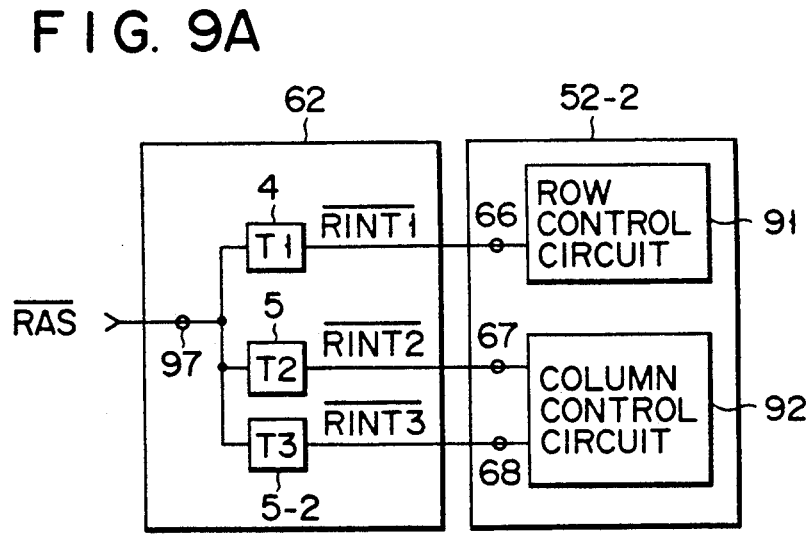
Figure 9C:
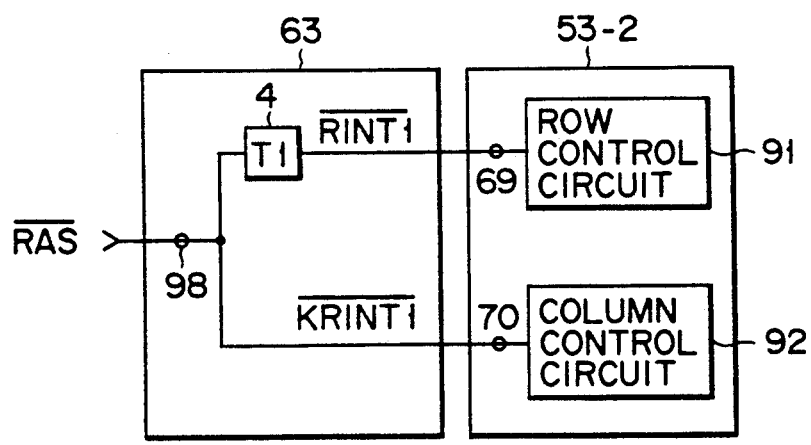
Figure 11:
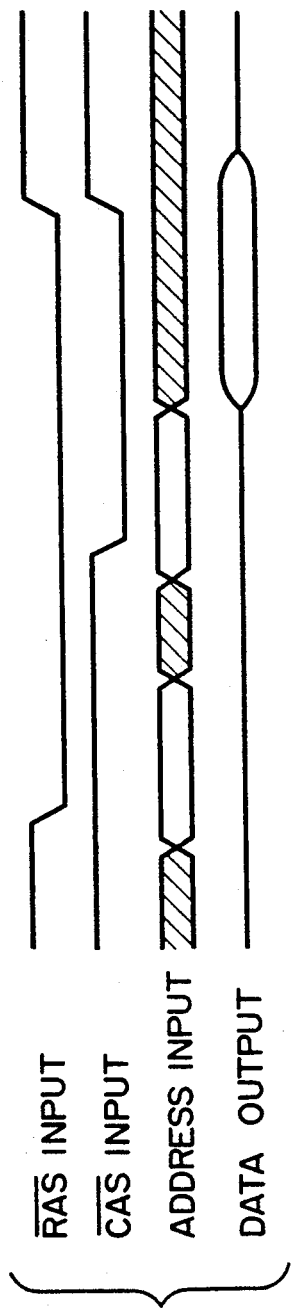
FIGS. 11, 12, 13, and 14 are timing charts explaining the operation of a conventional dynamic memory device.
Figure 12:
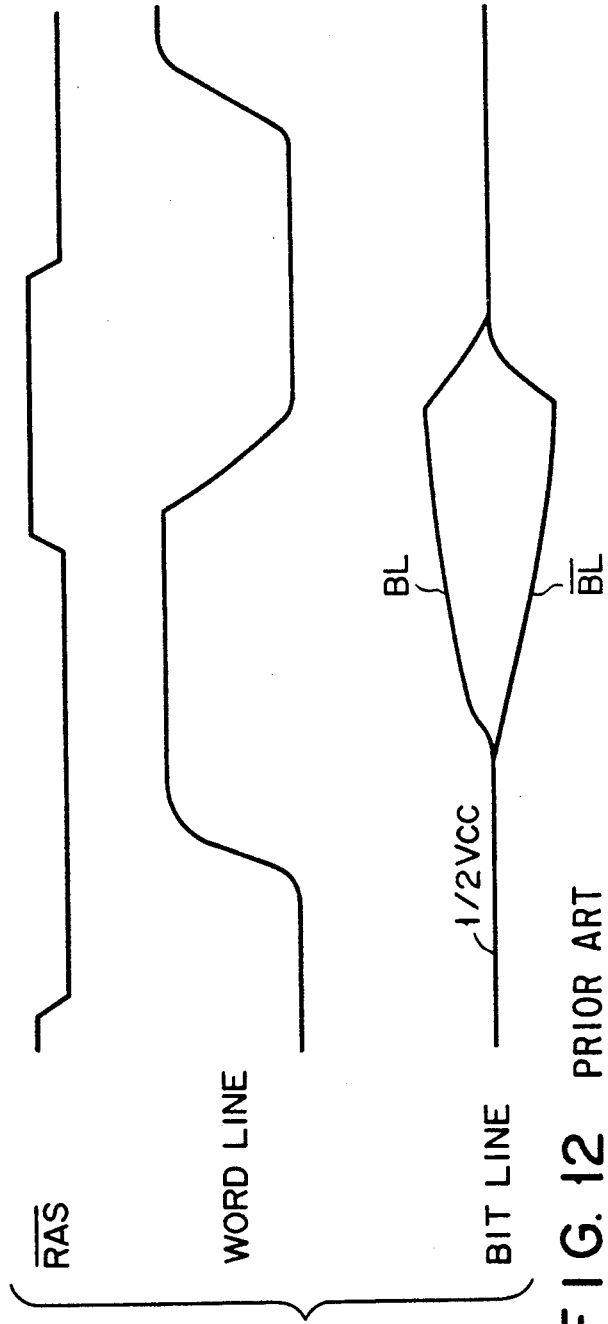
Figure 13:
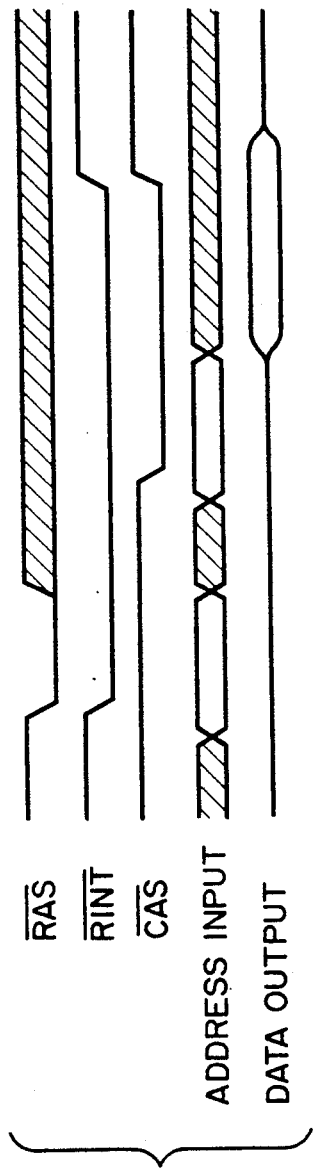
Figure 14:
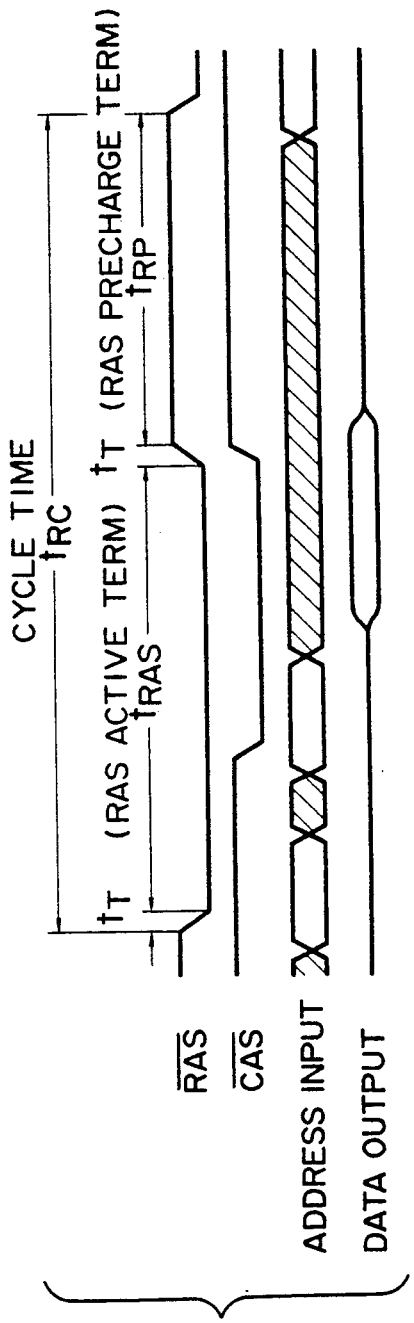

FIGS. 9A, 9B, and 9C are block diagrams schematically showing those units of a fourth, fifth, and sixth embodiments, each of which comprises at least one internal $\overline{RAS}$ signal generating section and two control circuits.

More precisely, the unit shown in FIG. 9A is formed of two chips 61 and 51-2. Timer circuits 4 and 5 are formed in the chip 62, and control circuits 91 and 92 are formed in the chip 51-2. As is shown in FIG. 9A, the external $\overline{RAS}$ signal is input to the chip 61 via an input terminal 96. In the chip 61, the timer circuit 4 generates an internal $\overline{RAS}$ signal RINT for controlling the row control circuit 91, whereas the timer circuit 5 generates an internal $\overline{RAS}$ signal $\overline{KRINT}$ for controlling the column control circuit 92. The signal RINT is supplied to the input terminal 64 of the chip 51-2, and the signal $\overline{KRINT}$ is supplied to the input terminal 65 of the chip 51-2. The external $\overline{RAS}$ signal can be supplied from a circuit located outside the chip 61.

The unit illustrated in FIG. 9B has chips 62 and 52-2. Three timer circuits 4, 5, and 5-2 are formed in the chip 62, and two control circuits 91 and 92 are formed in the chip 52-2. As is shown in FIG. 9B, the external $\overline{RAS}$ signal is input to the chip 62 via an input terminal 97. In the chip 62, the timer circuit 4 generates an internal signal RINT1 for controlling the row control circuit 91, the timer circuit 5 generates an internal $\overline{RAS}$ signal RINT2 for controlling the column control circuit 92, and the timer circuit 5-2 generates an internal $\overline{RAS}$ signal RINT3 for controlling also the column control circuit 92. The signal RINT1 is supplied to the input terminal 66 of circuit 91, and the signals RINT2 and RINT3 are supplied to the input terminal 65 of the circuit 92. The terminals 67 and 68 of the circuit 92, respectively, external $\overline{RAS}$ signal can be supplied from a circuit located outside the chip 62.

The unit shown in FIG. 9C has chips 63 and 53-2. One timer circuit 4 is formed in the chip 63, and two control circuits 91 and 92 are formed in the chip 53-1. The external $\overline{RAS}$ signal is input to the chip 63 through an input terminal 98. In the chip 63, the timer circuit 4 generates an internal $\overline{RAS}$ signals RINT-1 for controlling the row control circuit 91. The external $\overline{RAS}$ signal is directly or synchronously supplied to the chip 53-2 as KRINT-1. The signal RINT-1 is supplied to the input terminal 69 of the circuit 91, and the signal KRINT 1 to the input terminal 70 of the circuit 92. The external $\overline{RAS}$ signal can be supplied from a circuit outside the chip 63.

FIGS. 10A to 10F are circuit diagrams, each showing a circuit for generating an internal $\overline{RAS}$ which can be used in the present invention. The circuit illustrated in FIG. 10A can be used in the section shown in FIG. 1A. The circuit shown in FIG. 10B is a modification of the circuit illustrated in FIG. 10A; the external $\overline{RAS}$ input buffer 1, the timer circuits 4 and the internal $\overline{RAS}$ generating circuit 2 are different from their counterparts of the timer circuit shown in FIG. 10A. The circuit shown in FIG. 10C is different from the circuit of FIG. 10A, in that a NAND gate 71 is used in place of the flip-flop (FIG. 10A). The circuit shown in FIG. 10D is different from the circuit of FIG. 10B, in that a NAND gate 72 is used in place of the flip-flop (FIG. 10B). The circuit illustrated in FIG. 10E is a combination of the circuit shown in FIG. 10A and a circuit 81 for preventing the row control circuit 91 from being reset. The signal $\overline{WDUR}$ input to the circuit 81 is at the low level during the write duration of the DRAM. The circuit shown in FIG. 10F is a modification of the circuit shown in FIG. 10E; it differs in the structure of the timer circuit 4 and the circuit 81.

The circuits shown in FIGS. 10A to 10F can be used as circuits for generating an internal $\overline{RAS}$ signal for controlling both the row control circuit 91 and the column control circuit 92.

The present invention is not limited to the embodiments described above. Various changes and modifications can be made without departing the scope of the present invention.

As has been described, the present invention provide a dynamic memory and a dynamic memory system which reliably restore data on the bit lines, and operate at high speed at correct various $\overline{RAS}$ timings.

What is claimed is:

1. A control circuit for a semiconductor memory device comprising:
a $\overline{RAS}$ input terminal for receiving a row-address strobe ($\overline{RAS}$) signal having an active period with a predetermined starting point;
a row control circuit including a row-address control circuit for said semiconductor memory device; and
first timer means for receiving said $\overline{RAS}$ signal, for generating a row control signal, delayed by a first delay period, such that said row control signal is activated in response to said predetermined starting point of said active period, for each length of said active period when said active period is shorter than said first delay period, and for supplying said row control signal to said row control circuit.

2. A control circuit for a semiconductor memory device according to claim 1, further comprising a column control circuit including:
   a column address control circuit for the semiconductor memory; and
   second timer means for receiving said RAS signal, for generating a first column control signal, delayed by a second delay period, such that said first column control signal becomes active in response to said predetermined starting point of said active period, for each length of said active period when said active period is shorter than said second delay period, and for supplying said first column control signal to said column control circuit.

3. A control circuit for a semiconductor memory device according to claim 2, further comprising:
   third timer means for receiving the $\overline{RAS}$ signal, for generating a second column control signal, delayed by a third delay period, such that said second column control signal becomes active in response to said predetermined starting point of said active period, for each length of said active period when said active period is shorter than said third delay period, and for supplying said second column control signal to said column control circuit.

4. A control circuit for a semiconductor memory device according to claim 3, wherein said $\overline{RAS}$ signal is a pulse signal having a width of less than 80 nsec, and said third timer means is activated for said third delay period after said third timer means responds to said $\overline{RAS}$ signal.

5. A control circuit for a semiconductor memory device according to claim 3, wherein said third timer means comprises:
   a third inverter circuit for receiving a word-line driving signal:
   a third delay circuit, connected to the output of said third inverter circuit, for delaying the word-line driving signal by said third delay period; and
   a third 2-input NAND gate circuit having a first input for receiving the word-line driving signal, and a second input connected to the output of said third delay circuit.

6. A control circuit for a semiconductor memory device according to claim 3, wherein said first delay period is longer than said third active delay period, and said third active delay period is longer that said second active delay period.

7. A control circuit for a semiconductor memory device according to claim 3, wherein said third timer means supplies said delayed $\overline{RAS}$ signal to a column decoder incorporated in said column control circuit.

8. A control circuit for a semiconductor memory device according to claim 2, wherein said second timer means comprises:
   a second inverter circuit for receiving a word-line driving signal:
   a second delay circuit, connected to the output of said first inverter circuit, for delaying the word-line driving signal by said second delay period; and
   a second 2-input NAND gate circuit having a first input for receiving the wordline driving signal, and a second input connected to the output of said second delay circuit.

9. A control circuit for a semiconductor memory device according to claim 2, wherein said $\overline{RAS}$ signal is a pulse signal having a width of less than 80 nsec, and said second timer means is activated for said second delay period after said second timer means responds to said $\overline{RAS}$ signal.

10. A control circuit for a semiconductor memory device according to claim 2, wherein said first delay period is longer than said second delay period.

11. A control circuit for a semiconductor memory device according to claim 1, wherein said first timer means comprises:
   a first inverter circuit for receiving a word-line driving signal:
   a first delay circuit, connected to the output of said first inverter circuit, for delaying the word-line driving signal by said first delay period; and
   a first 2-input NAND gate circuit having a first input for receiving the word-line driving signal, and a second input connected to the output of said first delay circuit.

12. A control circuit for a semiconductor memory device according to claim 1, wherein said $\overline{RAS}$ signal is a pulse signal having a width of less than 80 nsec, and said first timer means is activated for said first delay period after said first timer means responds to said $\overline{RAS}$ signal.

13. A semiconductor memory device system comprising:
   a semiconductor chip including:
      a $\overline{RAS}$ input terminal for receiving a row-address strobe ($\overline{RAS}$) signal having an active period with a predetermined starting point; and
      first timer means for receiving said RAS signal, and for generating a row control signal, delayed by a first delay period, such that said row control signal becomes active in response to the predetermined starting point, for each length of said active period when said active period is shorter than said first delay period; and
   a semiconductor memory device including:
      a row control circuit;
      a column control circuit;
      a first input terminal for receiving said row control signal from said first timer means and for supplying said row control signal to said row control circuit; and
      a second input terminal for receiving said $\overline{RAS}$ signal and for supplying said $\overline{RAS}$ signal to said column control circuit.

14. A semiconductor memory device system according to claim 13, wherein said first timer means comprises:
   a first inverter circuit for receiving a word-line driving signal;
   a first delay circuit, connected to the output of said first inverter circuit, for delaying the word-line driving signal by said first delay period; and
   a 2-input NAND gate circuit having a first input for receiving said word-line driving signal, and a second input, connected to the output of said first delay circuit.

15. A semiconductor memory device system according to claim 13, wherein said $\overline{RAS}$ signal is a pulse signal having a width of less than 80 nsec, and said first timer means is activated for said first delay period after said first timer means responds to said $\overline{RAS}$ signal.

16. A semiconductor memory device system comprising:
   a semiconductor chip including:

a $\overline{RAS}$ input terminal for receiving a row-address strobe ($\overline{RAS}$), signal having an active period with a predetermined starting point:

first timer means for receiving said $\overline{RAS}$ signal, and for generating a row control signal delayed by a first delay period, such that said row control signal becomes active in response to the predetermined starting point, for each length of the active period when said active period is shorter than said first active period; and second timer means for receiving said $\overline{RAS}$ signal, and for generating a column control signal delayed by a second delay period, such that said column control signal becomes active in response to said predetermined starting point, for each length of said active period when said active period is shorter than said second delay period; and a semiconductor memory device including:
- a row control circuit;
- a column control circuit;
- a first input terminal for receiving said row control signal from said first timer means and for supplying said row control signal to said row control circuit; and
- a second input terminal for receiving said column control signal from said second timer means and for supplying said $\overline{RAS}$ signal to said column control circuit.

17. A semiconductor memory device according to claim 16, wherein said first delay period is longer than said second delay period.

18. A semiconductor memory device system according to claim 16, wherein said second timer means comprises:
- a second inverter circuit for receiving a word-line driving signal;
- a second delay circuit, connected to the output of said second inverter circuit, for delaying said word-line driving signal by said second delay period; and
- a second 2-input NAND gate circuit having a first input for receiving said word-line driving signal, and a second input, connected to the output of said second delay circuit.

19. A semiconductor memory device system according to claim 16, wherein said $\overline{RAS}$ signal is a pulse signal having a width of less than 80 nsec, and said second timer means is activated for said second delay period after said second timer means responds to said $\overline{RAS}$ signal.

20. A semiconductor memory device system comprising:

a semiconductor chip including:
- a $\overline{RAS}$ input terminal for receiving a row-address strobe ($\overline{RAS}$) signal having an active period with a predetermined starting point:
- first timer means for receiving said $\overline{RAS}$ signal, and for generating a row control signal delayed by a first delay period, such that said row control signal becomes active in response to said predetermined starting point, for each length of said active period when said active period is shorter than said first delay period;
- second timer means for receiving said $\overline{RAS}$ signal, and for generating a column control signal delayed by a second delay period, such that said column control signal becomes active in response to said predetermined starting point, for each length of said active period when said active period is shorter than said second delay period; and
- third timer means for receiving said $\overline{RAS}$ signal, and for generating a second column control signal delayed by a third delay period, such that said second column control signal becomes active in response to said predetermined starting point, for each length of said active period when said active period is shorter than said third delay period; and semiconductor memory device including:
- a row control circuit;
- a column control circuit;
- a first input terminal for receiving said row control signal from said first timer means and for supplying said row control signal to said row control circuit,
- a second input terminal for receiving said first column control signal from said second timer means and for supplying said first column control signal to said column control circuit, and
- a third input terminal for receiving said second column control signal from said third timer means and for supplying said second column control signal to said column control circuit.

21. A semiconductor memory device system according to claim 20, wherein said third timer means comprises:
- a third inverter circuit for receiving a word-line driving signal;
- a third delay circuit, connected to the output of said third inverter circuit, for delaying said word-line driving signal by said third active delay period; and
- a third 2-input NAND gate circuit having a first input for receiving said word-line driving signal, and a second input, connected to the output of said third delay circuit.

22. A semiconductor memory device system according to claim 20, wherein said third timer means supplies said delayed $\overline{RAS}$ signal to a column-address decoder in said column control circuit.

23. A semiconductor memory device according to claim 20, wherein said first delay period is longer than said third delay period, and said third delay period is longer than said second delay period.

24. A semiconductor memory device system according to claim 20, wherein said $\overline{RAS}$ signal is a pulse signal having a width of less than 80 nsec, and said third timer means is activated for said third delay period time after said third timer means responds to said $\overline{RAS}$ signal.

25. A semiconductor memory device system according to claim 20, wherein said second timer means comprises:
- a second inverter circuit for receiving a word-line driving signal;
- a second delay circuit, connected to the output of said second inverter circuit, for delaying the word-line driving signal by said second delay period; and
- a second 2-input NAND gate circuit having a first input for receiving the word-line driving signal, and a second input, connected to the output of said second delay circuit.

26. A semiconductor memory device according to claim 20, wherein said first delay period is longer than said second delay period.

27. A control circuit for a semiconductor memory device comprising:

a $\overline{\text{RAS}}$ input terminal for receiving a row-address strobe ($\overline{\text{RAS}}$) signal having an active period with a predetermined starting point;

a row control circuit, including a row-address control circuit;

a column control circuit, connected to the $\overline{\text{RAS}}$ input terminal, including a column-address control circuit; and a timer means for receiving the $\overline{\text{RAS}}$ signal, and for generating a row control signal delayed by a given active period, such that the row control signal becomes active in response to the predetermined starting point of the active period, for each length of the active period, when the active period is shorter than the given active period, and for supplying said row control signal to the row control circuit.

* * * * *